United States Patent [19]

Fukuda

[11] 4,135,963

[45] Jan. 23, 1979

[54] LITHIUM TANTALATE SINGLE CRYSTAL GROWTH FROM A PLATINUM-RHODIUM CRUCIBLE IN AN INERT GAS, NITROGEN OR REDUCING GAS ATMOSPHERE

[75] Inventor: Tsuguo Fukuda, Yokohama, Japan

[73] Assignee: Tokyo Shibaura Electric Co., Ltd., Kawasaki, Japan

[21] Appl. No.: 854,075

[22] Filed: Nov. 23, 1977

[30] Foreign Application Priority Data

Nov. 25, 1976 [JP] Japan .................. 51-140745

[51] Int. Cl.² .................. B01J 17/18; C01G 35/00
[52] U.S. Cl. .................. 156/617 SP; 156/DIG. 87; 156/DIG. 96; 156/DIG. 97; 156/DIG. 83; 75/172 E; 432/265; 423/593
[58] Field of Search .................. 156/DIG. 87, 617 SP, 156/DIG. 83, DIG. 97, DIG. 96; 75/172 E; 432/265; 252/62.9 R; 23/273 SP; 423/65, 184, 593

[56] References Cited

U.S. PATENT DOCUMENTS

| | | | |
|---|---|---|---|
| 2,106,527 | 1/1938 | Hostetter | 75/172 E |
| 2,142,660 | 1/1939 | Streicker | 432/265 |
| 2,190,296 | 2/1940 | Richardson | 75/172 E |
| 2,460,547 | 2/1949 | Stevens | 75/172 E |
| 3,533,755 | 10/1970 | Ballman | 156/DIG. 87 |
| 4,022,652 | 5/1977 | Hirano | 156/DIG. 87 |

FOREIGN PATENT DOCUMENTS

46-14825  7/1971  Japan .................. 156/DIG. 87

OTHER PUBLICATIONS

Rudd, Bell Lab Record Mag., 1973, #4, pp. 14–18.
Iwasaki, Rev. of Elec. Communi. Lab, vol. 20, #1–2, Jan.–Feb., 1972, pp. 129–137.
Nassau, Bell Tele. System Monograph #5219, 1966, pp. 1–6.
Nippon Telegraph & Tele. Pub. Corp., Growth and Prop. of $LiNbO_3$ Single Crystals, Niizeki et al., 10/20/66.
Ballman, J. of Cryst. Growth, 29, 1975, pp. 289–295.
Nassau, Bell Tel. Syst. Monograph, 5219, part 2, pp. 1–4, 1966.
Taguchi, Growth and Prop. of $LiNbO_3$ Single Cryst., 1966, pp. 1–11.

Primary Examiner—Stephen J. Emery
Attorney, Agent, or Firm—Flynn & Frishauf

[57] ABSTRACT

A method of producing a single crystal of lithium tantalate in a platinum-rhodium crucible containing 20 to 40% by weight of rhodium in an atmosphere of reducing or inert gas.

4 Claims, No Drawings

LITHIUM TANTALATE SINGLE CRYSTAL GROWTH FROM A PLATINUM-RHODIUM CRUCIBLE IN AN INERT GAS, NITROGEN OR REDUCING GAS ATMOSPHERE

BACKGROUND OF THE INVENTION

This invention relates to a method of producing piezoelectric oxide material and more particularly to a method of manufacturing a single crystal of lithium tantalate.

A single crystal for optical purposes has a piezoelectric property and is used with, for example, an elastic surface wave device. The single crystal of lithium tantalate is produced by various single crystal-growing methods, such as a pulling-up method, for example, a Czochralski method, pulling down method and laterally pulling method. The single crystal of lithium tantalate having a melting point of about 1,650° C presented difficulties in being manufactured in a platinum crucible. Hitherto, therefore, the single crystal of lithium tantalate has been produced in a crucible prepared from iridium having a high melting point in an atmosphere of reducing or inert gas. However, a single crystal of lithium tantalate produced by the above-mentioned prior art process had many crystal defects including oxygen defect. These defects could not be eliminated even by a subsequent heat treatment.

Such crystal defects led to the prominent dislocation density of the single crystal of lithium tantalate (said density being of the order of $10^5$ to $10^6$ lines/cm$^2$; see Journal of Crystal Growth, 24–25, pp 432 to 436, 1974), and in consequence the low mechanical strength thereof, thus presenting difficulties in being applied, for example, as a substrate of an elastic surface wave device.

Further, the single crystal of lithium tantalate produced in a crucible prepared from very expensive iridium unavoidably became costly. Moreover, when about ten single crystals of lithium tantalate were manufactured, the iridium crucible decreased in wall thickness or was bored with small holes, requiring repair now and then what was worse, repair was considerably expensive due to the high cost and high melting point of iridium.

The conventional method of manufacturing a single crystal of lithium tantalate in an iridium crucible had the drawbacks that the product was expensive and indicated a noticeable dislocation density, proving unadapted to be used as a surface wave intermediate frequency filter of, for example, a color television receiving set.

On the other hand, production of a single crystal of lithium niobate in a crucible prepared from a platinum-rhodium alloy is set forth in the research report No. 3027 by Yoichi Niizeki et al bearing the title "Growth and properties of a single crystal of lithium niobate" (issued on Oct. 20, 1966 by the Electric Telecommunication Institute of Nippon Telegraph and Telephone Public Corp.) on page 10 of this literature, the following passage appears: "rhodium was so readily soluble in melt of lithium niobate (LiNbO$_3$) that a crucible of platinum-rhodium alloy used in view of its anticipated prominent resistance to high temperature turned porous and proved unusable, though the melt of lithium niobate was kept at a temperature 500° C lower than the melting point of the platinum-rhodium alloy". Therefore, it has been considered impossible to use a crucible prepared from a platinum-rhodium alloy is manufacturing a single crystal of lithium tantalate having a similar crystalline structure to that of a single crystal of lithium niobate.

SUMMARY OF THE INVENTION

It is accordingly an object of this invention to provide a method of manufacturing a large number of single crystals of lithium tantalate at low cost by repeatedly using an inexpensive crucible prepared from a platinum-rhodium alloy.

Another object of the invention is to provide a method of manufacturing a single crystal of lithium tantalate, into which only an extremely small amount of rhodium, a component of said crucible, is carried, and in consequence which is substantially free from the afoesaid crystal defects.

Still another object of the invention is to provide a method manufacturing a single crystal of lithium tantalate particularly adapted to be used as a substrate of a surface wave intermediate frequency filter included in a color television receiving set.

The other objects and advantages of the invention will become apparent as the invention is more thoroughly discussed hereinafter.

According to an aspect of the invention, there is provided a method manufacturing a single crystal of lithium tantalate which comprises the step of growing a single crystal of lithium tantalate in a crucible prepared from a platinum-rhodium alloy containing 20 to 40% by weight of rhodium in an atmosphere of reducing and/or inert gas. Preferably, these gases introduced into a single crystal growing apparatus including the crucible at a flow rate of 0.1 to 10 l/min.

DETAILED DESCRIPTION OF THE PREFERRED EMBODIMENTS

Molten lithium tantalate is obtained by mixing high purity lithium carbonate (Li$_2$CO$_3$) and tantalum pentoxide (Ta$_2$O$_5$) in the stoichiometric ratio or congruent melt ratio and heating the mixture in a platinum-rhodium crucible. Or is necessary, the respective raw materials may be melted before mixed in the crucible. Preferably, a mixture of Li$_2$CO$_3$ and Ta$_2$O$_5$ is first sintered and then melted by heating. The sintered mass is produced by mixing Li$_2$CO$_3$ and Ta$_2$O$_5$ in the congruent ratio (that is Li/Ta=0.95) and heating the mixture at 1,200° C for about 5 hours. The sintered mass is press-worked into a plurality of, for example, discs. There discs are changed in the Pt-Rh alloy crucible in a required number. The charged mass is fully melted at a temperature of about 1,700° C. During the melting step and the subsequent step of growing a single crystal of lithium tantalate, an inert gas such as nitrogen gas and-/or a reducing gas such as hydrogen in introduced into the single crystal growing apparatus at a flow rate of 0.1 to 10 l/min. Where the flow rate falls from 0.1 l/min, then the Pt-Rh crucible is noticeably worn out. Conversely where the flow rate increases over 10 l/min, then double crystals undesirably tend to appear in the single crystal, or the single crystal is suddenly cooled while being pulled out of the crucible with the resultant occurrence of cracks.

After the temperature of the molten charge in the Pt-Rh crucible is controlled for the growth of a single crystal of lithium tantalate, a seed crystal of lithium tantalate is brought into contact with the molten mass. Where the single crystal is produced by, for example, the pulling up method, the temperature of the molten mass should preferably be controlled to a level approximating the melting point of lithium tantalate, that is, about 1,650° C. The size of the seed crystal, though not particularly limited, may be determined according to the capacity of the crucible.

The method of this invention of manufacturing a single crystal of lithium tantalate is characterized in that a Pt-Rh crucible is used which is essentially formed of 80 to 60% by weight of platinum and 20 to 40% by weight of rhodium; and the preparation of the initial melt of lithium tantalate and the growth of the single crystal thereof are carried out in an atmosphere of an inert gas or reducing gas or a mixture thereof.

Experiments show that the wall of a Pt-Rh crucible should generally have a temperature of at least 1,850° C to assure an effective intrafurnace temperature distribution for the growth of a single crystal of lithium tantalate. Further, the wall of a Pt-Rh crucible more than 60mm in diameter is required to have a temperature of at least 1,880° C for the initial melting of lithium tantalate. A Pt-Rh crucible containing less than 20% by weight of rhodium has a lower melting point than 1,900° C, indicating too short a service life for practical application. Though governed by the wall thickness, a Pt-Rh crucible containing 20 to 40% by weight of rhodium can produce a far larger number of single crystals of lithium tantalate than a similar crucible containing a smaller amount of rhodium. A Pt-Rh crucible containing more than 40% by weight of rhodium becomes too brittle to be effectively operated.

For reference, the present inventor et al previously developed a method of manufacturing a single crystal of lithium tantalate in a Pt-Rh crucible in an oxidizing atmosphere, for example, in the open air and filed a patent application (Ser. No. 776,207) for this method in the United States of America. This application was based on the discovery that when used in an oxidizing atmosphere, the Pt-Rh crucible physically withstood the manufacture of twenty single crystals of lithium tantalate, namely, was saved from, for example, thermal deformation and the occurrence of small pores. However, this proposed method still had the following drawbacks.

(1) Rhodium, a component of the Pt-Rh crucible, was excessively dissolved in the molten mass, causing the produced single crystal to be tinted dark brown. Where a larger number of single crystals of lithium tantalate were manufactured by changing additional molten mass, the color of the product was more deepened, presenting difficulties in the examination of a wafer prepared from such single crystal by, for example, a polarized light.

(2) A large content of rhodium in the molten mass tended to give rise to the structural supercooling of the molten mass. As the result, air bubbles or cracks appeared in a single crystal of lithium tantalate produced, with the resultant deterioration thereof.

(3) Unduly large dissolution of the rhodium component of the Pt-Rh crucible in the molten mass roughened the inner surface of the crucible, with the resultant depletion of the crucible itself. Consequently, the crucible could only be operated about twenty times.

(4) Platinum of the Pt-Rh crucible was also excessively dissolved in the molten mass. The platinum deposited on the surface of a single crystal of lithium tantalate while the molten mass was pulled up gave rise to, for example, the dislocation and in consequence deterioration of the single crystal produced.

Where, however, a single crystal of lithium tantalate is manufactured in an atmosphere of an inert or reducing gas running through the Pt-Rh crucible at a flow rate of 0.1 to 10 l/min, then the above-mentioned drawbacks are all eliminated. What deserves a particular notice is that the transfusion of rhodium from the crucible into the molten mass is restricted to decrease the content of said rhodium in the product single crystal of lithium tantalate to 5 to 30 ppm thereof. As the result, the single crystal has a light yellow color. The above-mentioned content of rhodium is far smaller than 90 to 300 ppm of rhodium carried into a single crystal of lithium tantalate produced in an oxidizing atmosphere. Yet, a single crystal of lithium tantalate obtained by the method of this invention has substantially as small a dislocation density and as small a temperature coefficient with respect to the propagation velocity of a surface wave as a single crystal of lithium tantalate containing 90 to 300 ppm of rhodium. Therefore, the present single crystal of lithium tantalate is well adapted for use as a substrate of a surface wave intermediate frequency filter. Further, this invention reduces an amount of rhodium transfused from the Pt-Rh crucible into the molten mass, thereby increasing a number of single crystals of lithium tantalate produced in the same crucible to about 2.5 times that of similar single crystals prepared in an oxidizing atmosphere.

Comparison is given in Table 1 below between the effect of an atmosphere of an inert or reducing gas applied in the present invention and that of an oxidizing atmosphere used on the manufacture of a single crystal of lithium tantalate.

Table 1

| Effect of atmosphere on manufacture of a single crystal of $LiTaO_3$ | | | |
|---|---|---|---|
| | Kind of atmosphere | Open air | $N_2$ gas running at a flow rate of 3 l/min (present invention) |
| Color | Molten mass | Dark brown | Light yellow |
| | Grown single crystal | Dark brown | Light yellow |
| Content of rhodium (ppm) | Molten mass | 90 – 300 | 5 – 30 |
| | Grown single crystal | 90 – 300 | 5 – 30 |
| Number of times a* crucible can be used | | 20 | 50 |

*a Pt-Rh crucible containing 30% by weight of rhodium and having the measurements of 60mm diameter × 60mm height × 2mm wall thickness.

Where a single crystal of lithium tantalate is manufactured in the open air or an oxidizing atmosphere, rhodium contained in the Pt-Rh crucible is transfused into the molten mass in the form of $Rh^{3+}$, prominently depleting the crucible and decreasing the frequency of its application. Moreover, a molten mass seemingly formed of $LiTaO_3$-$Rh_2O_3$ system, presents a dark brown color and is readily subject to structural supercooling.

Conversely where a single crystal of lithium tantalate is produced in an atmosphere of reducing or inert gas, an amount of rhodium transfused from the Pt-Rh crucible into the molten mass decreases to about one-tenth of the transfused amount of rhodium when the single crystal is manufactured in the open air. Consequently a single crystal of lithium tantalate prepared by the method of this invention contains only a small amount of rhodium, is very faintly tinted, and is not subject to structural supercooling.

A Pt-Rh crucible is unavoidably subject to weight loss during the manufacture of a single crystal of lithium tantalate. Table 2 below indicates the effect of an atmosphere used in the manufacture of a single crystal of lithium tantalate on the weight loss of the Pt-Rh crucible.

Table 2

Effect of atmosphere on the weight loss of Pt-Rh crucible

| Size of the crucible | Kind of atmosphere | Number of single crystals of LiTaO$_3$ produced | Deformation and depletion of the crucible | Weight loss of the crucible (g) | Weight loss of the crucible per single crystal of LiTaO$_3$ |
|---|---|---|---|---|---|
| 38φ×39h×1t | open air | 22 | Bored and unusable | — | — |
| 120φ×130h×2t | Open air | 20 | Bored and unusable | 79.9 | 4.00 (=0.17%) |
| 80φ×80h×2t | Open air | 8 | Still usable | 20.4 | 2.55 (=0.3%) |
| 80φ×80h×2t | N$_2$ gas running at 3 l/min | 40 | Little changed and still usable | 0.01 | 0.0003 (=0.00004%) |
| 60φ×60h×2t | N$_2$ gas running at 3 l/min | 50 | Little changed and still usable | 0.01 | 0.0002 (=0.0004%) |
| 120φ×120h×25 | N$_2$ gas running at 3 l/min | 30 | Little changed and still usable | 12.6 | 0.42 (=0.02%) |

Where one single crystal of lithium tantalate is produced in the open air, a Pt-Rh crucible loses about 0.2 to 0.3% of weight. When, therefore, about 20 single crystals of lithium tantalate are manufactured in the open air, the crucible is bored and becomes unusable. In contrast, where more than 30 single crystals of lithium tantalate are produced in an atmosphere of N$_2$ gas according the method of this invention, the crucible is very little worn out. Therefore, the Pt-Rh crucible has a service life about 2.5 times longer than when used in the open air, thereby rendering a single crystal of lithium tantalate less costly than in the prior art.

This invention will be more fully understood by reference to the examples which follow.

EXAMPLE 1

2,000g of a sintered mass of lithium tantalate was charged in a crucible (measuring 80mmφ×80mmh×1.5mmt) formed of 70% by weight of platinum and 30% by weight of rhodium. After the sintered mass was melted in a high frequency furnace, a single crystal of lithium tantalate measuring 35mmφ×100mml was grown using a seed crystal of lithium tantalate by the pulling-up method. Nitrogen gas was conducted at a flow rate of 3 l/min. during the melting of the sintered mass and the growth of a single crystal of lithium tantalate. The molten mass was pulled up in the direction of the X-axis at a speed of 7 mm/h while being rotated at 40 rpm to produce a single crystal of lithium tantalate. The single crystal thus produced indicated a slightly more reddish brown color than a product prepared in a crucible of iridium, but did not turn dark brown as when prepared in the open air or an oxidizing atmosphere. The rhodium content of a single crystal produced in an atmosphere of N$_2$ gas was analyzed to be 10 to 30 ppm, a value equal to only about one-tenth of that of a dark brown single crystal of lithium tantalate manufactured in the open air.

EXAMPLE 2

A plurality of single crystals of lithium tantalate were manufactured under exactly the same conditions as in Example 1 by additionally charging an equal amount of a sintered mass of lithium tantalate to that portion of the molten mass which was pulled up for the growth of a single crystal of lithium tantalate. Seven single crystals of lithium tantalate were manufactured by repeating the above-mentioned process. The second and following single crystals of lithium tantalate were little different from the first one in respect of the color and the content of rhodium. These seven single crystals did not tend to grow in the cellular form as when structural supercooling occurred, thus proving to be of high quality.

EXAMPLE 3

A single crystal of lithium tantalate was prepared under the same conditions as in Example 1 in the same type of crucible as used in Example 1 in an atmosphere of argon passing through a Pt-Rh crucible at a flow rate of 3 l/min. The single crystal thus produced had as high quality as in Example 1.

EXAMPLE 4

A single crystal of lithium tantalate was produced under substantially the same conditions as in Example 1, excepting that the atmosphere of nitrogen gas was replaced by that of hydrogen gas. The single crystal thus prepared proved to be of as high quality as in Example 1.

The method of this invention can manufacture a single crystal of lithium tantalate which has a more excellent quality for use as a surface wave propagation substrate at a lower cost than the prior art using a crucible of iridium.

Further, the method of the invention has the following advantages over the aforesaid U.S. patent application Ser. No. 776,207.

(1) A single crystal of lithium tantalate obtained by the method of the invention has a far less dark brown color, admitting of the examination of a wafer by, for example, a polarized light.

(2) Single crystals of lithium tantalate manufactured in the open air varied in the shade of color. However, single crystals of lithium tantalate produced by the method of this invention indicate a substantially uniform color.

(3) An amount of rhodium transfused from a Pt-Rh crucible into a molten mass decreases to about one-tenth of that which occurred when a single crystal of lithium tantalate was produced in the open air. Consequently, an amount of rhodium carried into the product single crystal is prominently reduced. Where a plurality of single crystals of lithium tantalate were manufactured in the open air by charging additional amounts of a sintered mass of lithium tantalate in the Pt-Rh crucible, then about the tenth product indicated a noticeable growth of a cellular structure with the resultant appearance of cracks. Even where cracks did not arise, the product single crystal of lithium tantalate showed a noticeable local structural change due to the growth of cells such as air bubbles, failing to be applied as a surface wave wafer. According to this invention, however, even the tenth single crystal of lithium tantalate little changed in quality from the first one.

(4) The platinum component of the Pt-Rh crucible is transfused into the molten mass in a far smaller amount than when a single crystal of lithium tantalate was produced in the open air, and consequently less tends to be deposited on the surface of the single crystal, thereby saving it from deterioration.

(5) The service life of the Pt-Rh crucible has become about 2.5 times longer than that which was indicated when a single crystal of lithium tantalate was manufactured in the open air.

(6) Where a wafer of a surface wave intermediate frequency filter is prepared from a single crystal of lithium tantalate obtained by the method of this invention with a sufficiently high quality to meet the specification, then it is possible to decrease the requirement of raw material by about 20%.

Further, the advantageous effect of this invention is assured even in the manufacture of a single crystal of lithium tantalate which has a different Li/Ta ratio from what is observed in the customarily manufactured product, a single crystal of lithium tantalate containing niobium, a single crystal expressed by the structural formula of $LiTa_xNb_{1-x}O_3$, or a single crystal of lithium tantalate containing any other impurity than niobium.

What is claimed is:

1. A method of manufacturing a single crystal of lithium tantalate by bringing a seed crystal of lithium tantalate into contact with a melt consisting essentially of lithium tantalate in a crucible and pulling the molten mass containing said seed crystal out of the crucible to form said single crystal, the improvement comprising forming a single crystal from said melt in said crucible, said crucible consisting essentially of a platinum-rhodium alloy containing between 20 and 40% by weight rhodium, in an atmosphere selected from the group consisting of nitrogen, reducing gas, inert gas, and mixtures thereof, supplied at a flow rate between 0.1 and 10 liters per minute, to form a lithium tantalate single crystal containing between 5 and 30 ppm by weight rhodium.

2. The method according to claim 1, wherein said atmosphere is nitrogen gas.

3. The method according to claim 1, wherein said atmosphere is hydrogen gas.

4. The method according to claim 1, wherein the single crystal of lithium tantalate is manufactured in an atmosphere formed of a mixture of said gases.

* * * * *

UNITED STATES PATENT AND TRADEMARK OFFICE
CERTIFICATE OF CORRECTION

PATENT NO. : 4,135,963
DATED : January 23, 1979
INVENTOR(S) : TSUGUO FUKUDA et al It is certified that error appears in the above-identified patent and that said Letters Patent are hereby corrected as shown below:

Column 1, line 12: after "crystal", insert
---of lithium tantalate originally developed---.

Signed and Sealed this

Twenty-fifth Day of September 1979

[SEAL]

Attest:

LUTRELLE F. PARKER
Attesting Officer   Acting Commissioner of Patents and Trademarks